(12) United States Patent
Yamamoto

(10) Patent No.: US 6,200,876 B1
(45) Date of Patent: Mar. 13, 2001

(54) METHOD OF PRODUCING A SEMICONDUCTOR DEVICE

(75) Inventor: Ichiro Yamamoto, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/310,997

(22) Filed: May 13, 1999

(30) Foreign Application Priority Data

May 14, 1998 (JP) ................................... 10-132153

(51) Int. Cl.⁷ .................................................. H01L 21/20
(52) U.S. Cl. ........................ 438/396; 438/255; 257/309
(58) Field of Search .................................... 438/396, 398, 438/964, 253, 255; 437/60, 47, 52, 138, 173; 257/309, 534, 538, 734

(56) References Cited

U.S. PATENT DOCUMENTS

| | | | |
|---|---|---|---|
| 5,366,917 | * 11/1994 | Watanabe et al. | 437/47 |
| 5,372,962 | * 12/1994 | Hitora et al. | 437/47 |
| 5,486,488 | * 1/1996 | Kamiyama | 437/60 |
| 5,623,243 | * 4/1997 | Watanabe et al. | 257/309 |
| 5,723,379 | * 3/1998 | Watanabe et al. | 438/398 |

FOREIGN PATENT DOCUMENTS

| | | |
|---|---|---|
| 7-14797 | 1/1995 | (JP) . |
| 9-321235 | 12/1997 | (JP) . |
| 10-107225 | 4/1998 | (JP) . |
| 10-275901 | 10/1998 | (JP) . |

* cited by examiner

*Primary Examiner*—David Nelms
*Assistant Examiner*—Phuc T. Dang
(74) *Attorney, Agent, or Firm*—Sughrue, Mion, Zinn, Macpeak & Seas, PLLC

(57) ABSTRACT

A method of producing a semiconductor device includes a heat-treating step of heat-treating an HSG'ed capacitor electrode in a dopant gas which does not form a reaction product with silicon. In the heat-treating step, heat treatment is performed in an atmosphere containing the dopant gas of $AsH_3$ in a clean condition such that no oxide film is formed on the surface of each HSG after the HSG is formed. The heat treatment is carried out at a temperature between 550 and 800° C. so that a dopant of arsenic (As) at a high concentration is introduced into the HSG 2a without reducing the size of the HSG 2a by the heat treatment to thereby suppress reduction in capacitance due to depletion. In this condition, when the dopant of As is introduced into the interior of the HSG 2a to form a diffusion region P1, the size of the HSG 2a is not reduced after the diffusion.

7 Claims, 4 Drawing Sheets

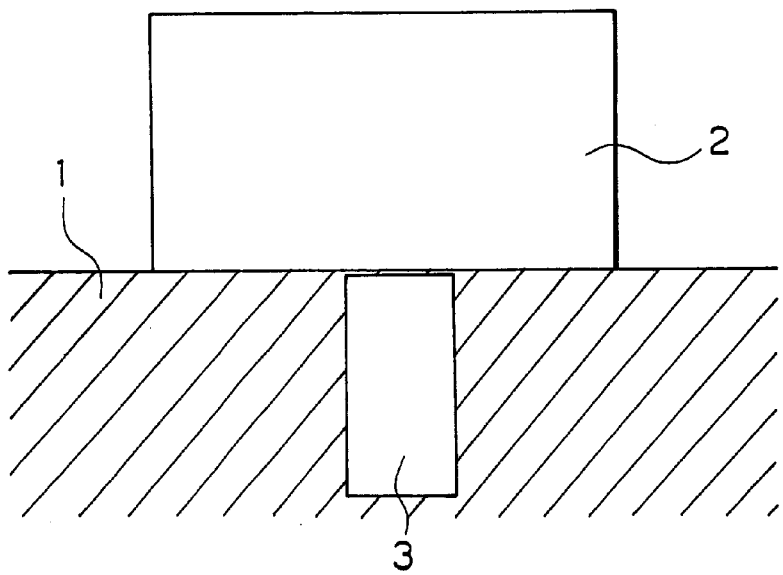
FIG. IA
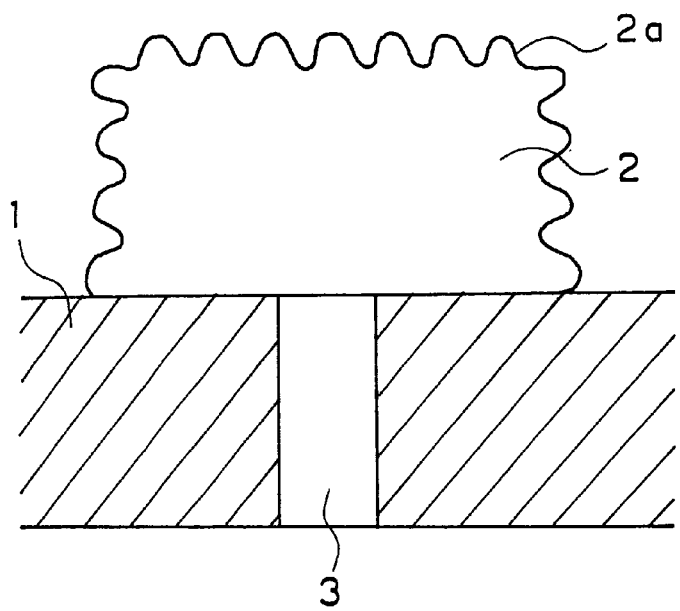
FIG. IB

METHOD OF PRODUCING A SEMICONDUCTOR DEVICE

BACKGROUND OF THE INVENTION

This invention relates to a method of producing a semiconductor device in which a hemispherical-grained (HSG'ed) capacitor electrode comprising a lower electrode of a silicon film, a dielectric film, and an upper electrode is formed on a semiconductor substrate and, in particular, to a method of producing a semiconductor device in which a hemispherical-grained (HSG'ed) capacitor electrode is heat-treated to introduce into hemispherical grains (HSGs) a dopant of a high concentration.

In a semiconductor device such as a DRAM (Dynamic Random Access Memory), it is generally required to form a capacitor electrode such as a stacked capacitor and a trench capacitor. For example, a capacitor electrode is formed in the following manner. At first, a polysilicon film is grown on a semiconductor substrate with an insulator film interposed therebetween. Then, an impurity such as phosphorus (P) is introduced into the polysilicon film. Thereafter, the polysilicon film is patterned by plasma etching using a photoresist film to form a lower electrode. After the surface of the lower electrode is coated with a dielectric film comprising an oxide film or a nitride film, an upper electrode is formed in the manner similar to the formation of the lower electrode. Herein, a combination of the lower electrode, the dielectric film, and the upper electrode forms the capacitor electrode.

There are various previous techniques relating to manufacture of the semiconductor device, such as the DRAM, having the capacitor electrode. For example, methods of producing semiconductor devices are disclosed in Japanese Unexamined Patent Publications (JP-A) Nos. 5-343614, 7-38062, and 9-289292.

In these previous techniques, formation of the capacitor electrode may or may not include a hemispherical-graining process (HSG process). In the capacitor electrode, the shape of the lower electrode on a capacitor contact formed in the semiconductor substrate of $SiO_2$ is different depending upon whether or not the HSG process is carried out. Specifically, the HSG process produces a number of HSGs as mushroom-like protrusions on the surface of the lower electrode to thereby increase the surface area of the lower electrode. The surface area increased by the presence of the HSGs reaches about twice as compared with the case where no HSG process is performed. Therefore, the capacitor electrode subjected to the HSG process, which will hereafter be referred to as a hemispherical-grained (HSG'ed) capacitor electrode, has an ideal capacitance increased to about twice corresponding to the increase in surface area.

In recent years, there is a strong demand for a low heat-treatment temperature in a capacitor forming process because of a sophisticated device design. For example, in case of a 1GDRAM or a DRAM mounted together with a logic circuit, high-temperature heat treatment using a furnace is difficult to perform in the capacitor forming process. As the heat-treatment temperature becomes lower, the HSG'ed capacitor electrode suffers the reduction in capacitance due to depletion.

In the HSG'ed capacitor electrode, a capacitance versus voltage (C—V) characteristic representing the relationship between a capacitance and an applied voltage upon the upper electrode is such that, when a process temperature after formation of the HSGs is lowered, the decrease in capacitance is significant if the applied voltage upon the upper electrode has a negative value. This is because the interior of each HSG is depleted.

The reason why such depletion of the HSG is caused following the decrease in process temperature will presently be described. Specifically, immediately after the HSGs are formed in the HSG process, the interior of each HSG is a depletion region in a non-doped state. After the high-temperature heat treatment subsequently carried out, phosphorus is sufficiently diffused from a stack into each HSG so that the depletion region is lost. On the other hand, if doping is carried out only by the heat treatment at a low process temperature, diffusion of phosphorus into each HSG is insufficient so that the depletion region still remains. Due to the presence of the depletion region, the decrease in capacitance occurs when the applied voltage upon a plate electrode has a negative value.

In order to suppress the above-mentioned depletion, proposal is made of solid-phase diffusion of phosphorus using $POCl_3$. Specifically, an HSG'ed wafer is heat-treated in a furnace with $POCl_3$ contained therein. By doping using such phosphorus diffusion, $SiO_2$ containing phosphorus at a high concentration is formed on the surface of each HSG. Therefore, phosphorus is introduced from $SiO_2$ into the HSG so that a phosphorus diffusion region is formed.

However, in case of the hoping using the above-mentioned phosphorus diffusion, a PSG (Phospho Silicate Glass) film is formed by the use of oxidation of silicon in order to obtain $SiO_2$ containing phosphorus. Therefore, each HSG is decreased in size after the diffusion as compared with that before the diffusion. As a result, the HSG is decreased in volume so that the surface area of the HSG is reduced. This makes it difficult to achieve a sufficient increase in capacitance. In addition, a base portion of each HSG becomes thin and is therefore reduced in mechanical strength.

SUMMARY OF THE INVENTION

It is a technical object of this invention to provide a method of producing a semiconductor device, which is capable of avoiding reduction in capacitance due to depletion by carrying out heat treatment at a moderate temperature without reducing the size of each HSG.

According to this invention, there is provided a method of producing a semiconductor device, including a capacitor electrode forming stop of forming on a semiconductor substrate an HSG'ed capacitor electrode comprising a lower electrode of a silicon film, a dielectric film, and an upper electrode, the method further comprising a heat-treating step of heat-treating the HSG'ed capacitor electrode in a dopant gas which does not produce a reaction product with silicon.

In the heat-treating step, heat treatment is carried out in an atmosphere containing the dopant gas in a clean condition such that no oxide film is formed on the surface of each HSG after the HSG is formed.

In the heat-treatment step, the dopant gas is introduced at a high concentration into the HSG without reducing the size of the HSG by the heat treatment.

In the above-mentioned method, the HSG'ed lower electrode after the HSG has grown is exposed in a gas containing the dopant gas within a chamber where the HSG has grown and without breaking a vacuum.

Preferably, the dopant gas is selected from $AsH_3$ and $PH_3$. If $AsH_3$ is used as the dopant gas, the heat treatment in the heat-treating step is preferably carried out at a temperature between 550 and 800° C.

BRIEF DESCRIPTION OF THE DRAWING

FIGS. 1A and 1B are side sectional views showing characteristic parts of existing capacitor electrodes which are not and are subjected to an HSG process, respectively;

DESCRIPTION OF THE PREFERRED EMBODIMENT

Figure 2A:
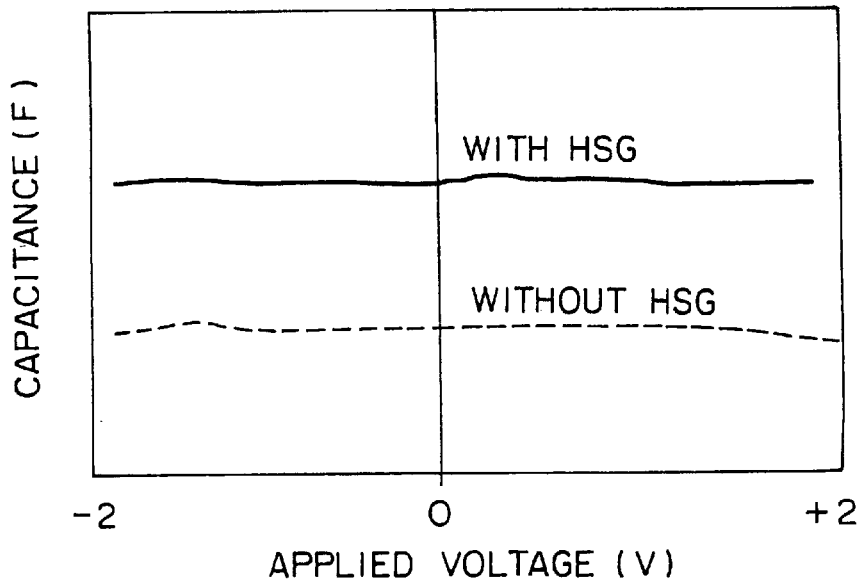
FIGS. 2A and 2B show capacitance versus voltage (C—V) characteristics of the capacitor electrode illustrated in FIG. 1B, i.e., an HSG'ed capacitor electrode, in different conditions.

For a better understanding of this invention, description will at first be made about a method of producing a semiconductor device as a previous technique with reference to the drawing.

In the semiconductor device such as a DRAM, a capacitor electrode comprising a lower electrode, a dielectric film, and an upper electrode is formed with or without an HSG process, as described above.

Referring to FIGS. 1A and 1B, capacitor electrodes are formed without and with the HSG process, respectively.

As seen from these figures, the shape of a lower electrode 2 on a capacitor contact 3 formed in a semiconductor substrate 1 of $SiO_2$ is different depending upon whether or not the HSG process is carried out. Specifically, the HSG process produces a number of HSGs 2a as mushroom-like protrusions, each having a diameter on the order between 300 and 700 angstroms, on the surface of the lower electrode 2 to thereby increase the surface area of the lower electrode 2. The surface area increased by the presence of the HSGs 2a reaches about twice as compared with the case where no HSG process is performed. Therefore, the capacitor electrode subjected to the HSG process, i.e., the HSG'ed capacitor electrode, has an ideal capacitance increased to about twice corresponding to the increase in surface area.

Figure 2B:
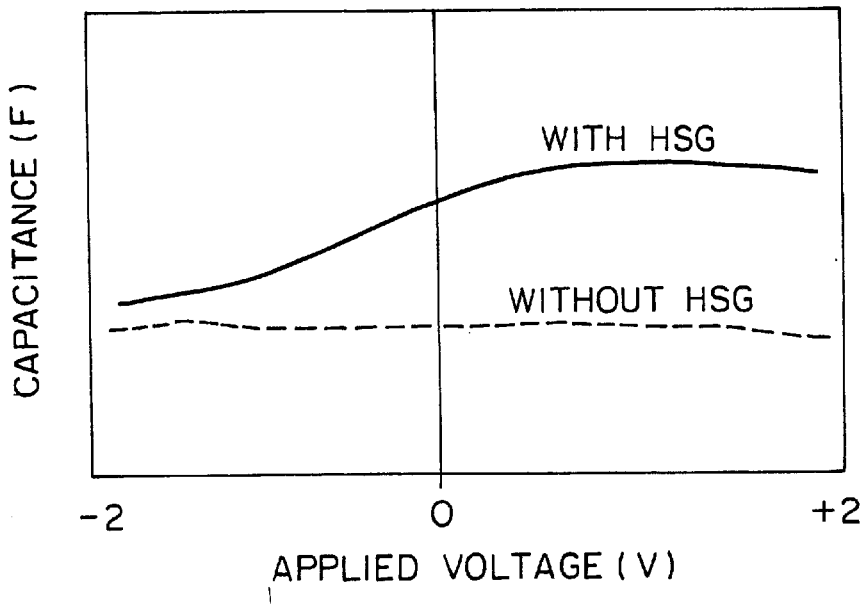

In recent years, there is a strong demand for a low heat-treatment temperature in a capacitor forming process because of a sophisticated device design. For example, in case of a 1GDRAM or a DRAM mounted together with a logic circuit, heat treatment at a high temperature exceeding 800° C. using a furnace is difficult to perform in the capacitor forming process. As the heat-treatment temperature becomes lower, the HSG'ed capacitor electrode suffers the reduction in capacitance due to depletion. Referring to FIGS. 2A and 2B, the HSG'ed capacitor electrode illustrated in FIG. 1B has C—V characteristics, i.e., a capacitance (F) versus an applied voltage (V) upon the upper electrode, as illustrated in the figures. In FIG. 2A, an ideal increase in capacitance, i.e., about twice as mentioned above, is obtained. In FIG. 2B, a process temperature after formation of the HSGs is lowered (for example, the highest heat-treatment temperature is 800° C. lasting for 10 minutes.

From comparison between FIGS. 2A and 2B, it is seen that, when the process temperature after formation of the HSGs is lowered, the decrease in capacitance is significant if the applied voltage upon the upper electrode (applied voltage upon a plate electrode) V has a negative value. This shows that the interior of each HSG is depleted.

Figure 3A:
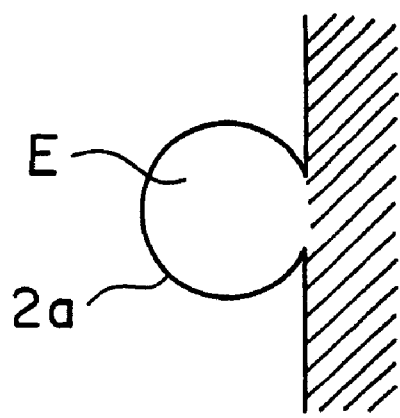
FIGS. 3A through 3C are side sectional views of a characteristic part of the HSG'ed capacitor electrode immediately after the HSG process, after high-temperature heat treatment, and after doping only by low-temperature heat treatment, respectively.
Figure 3B:
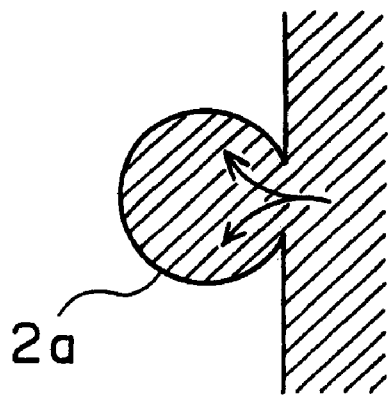
Figure 3C:
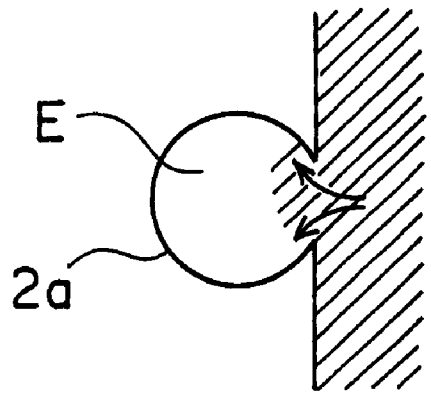

Referring to FIGS. 3A through 3C, description will be made about the reason why such depletion of the HSG is caused following the decrease in process temperature. Specifically, immediately after the HSGs 2a are formed in the HSG process, the interior of each HSG 2a is a depletion region E in a non-doped state, as illustrated in FIG. 3A. After the high-temperature heat treatment subsequently carried out, phosphorus is sufficiently diffused from a stack into each HSG 2a so that the depletion region E is lost, as illustrated in FIG. 3B. On the other hand, if doping is carried out only by the heat treatment at a low process temperature, diffusion of phosphorus into each HSG 2a is insufficient so that the depletion region E still remains, as illustrated in FIG. 3C. Due to the presence of the depletion region E, the decrease in capacitance occurs when the applied voltage upon the plate electrode has a negative value.

Figure 4:
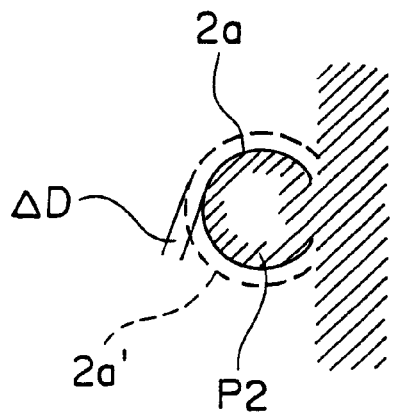
FIG. 4 is a side sectional view of the characteristic part of the HSG'ed capacitor electrode subjected to doping by phosphorus diffusion.

In order to suppress the above-mentioned depletion, proposal is made of solid-phase diffusion of phosphorus using $POCl_3$. Specifically, an HSG'ed wafer is heat-treated in a furnace with $POCl_3$ contained therein. By doping using such phosphorus diffusion, $SiO_2$ containing phosphorus at a high concentration is formed on the surface of each HSG 2a, as illustrated in FIG. 4. Therefore, phosphorus is introduced from $SiO_2$ into the HSG 2a so that a phosphorus diffusion region P2 is formed.

However, in case of the doping using the above-mentioned phosphorus diffusion, a PSG (Phospho Silicate Glass) film is formed by the use of oxidation of silicon in order to obtain $SiO_2$ containing phosphorus. Therefore, each HSG 2a is decreased in size by $\Delta D$ after the diffusion as compared with that before the diffusion (depicted by an imaginary circle 2a' in FIG. 4). As a result, the HSG 2a is decreased in volume so that the surface area of the HSG 2a is reduced. This makes it difficult to achieve a sufficient increase in capacitance. In addition, a base portion of each HSG 2a becomes thin and is therefore reduced in mechanical strength.

Now, description will be made about a method of producing a semiconductor device according to this invention. The method generally comprises a capacitor electrode forming step of forming on a semiconductor substrate an HSG'ed capacitor electrode comprising a lower electrode of a silicon film, a dielectric film, and an upper electrode, followed by a heat-treating step of heat-treating the HSG'ed capacitor electrode in a dopant gas which does not produce a reaction product with silicon. In the heat-treating step, the heat treatment is carried out in an atmosphere containing the dopant gas in a clean condition such that no oxide film is formed on the surface of each HSG after formation of the HSGs. For example, the dopant gas is selected from $AsH_3$ and $PH_3$. In the heat-treating step, the heat treatment is carried out at a temperature such that the dopant gas is introduced into the HSGs at a high concentration without reducing the size of each HSG by the heat treatment so as to suppress the decrease in capacitance due to depletion. After the HSG has grown, the HSG'ed lower electrode is exposed in a gas containing the dopant gas within a chamber where the HSG has grown and without breaking a vacuum. If $AsH_3$ is used as the dopant gas, the heat-treatment temperature in the heat-treating step is preferably between 550 and 800° C.

Figure 5:
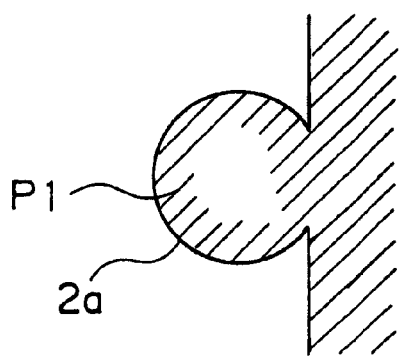
FIG. 5 is a side sectional view of a characteristic part of an HSG'ed capacitor electrode subjected to doping by $AsH_3$ vapor-phase diffusion according to one embodiment of this invention.

Referring to FIG. 5, the capacitor electrode is formed by doping using vapor-phase diffusion of $AsH_3$ according to one embodiment of this invention to suppress the depletion of the HSG. Herein, the heat-treatment temperature is selected between 550 and 800° C. so that arsenic (As) as the dopant of a high concentration is introduced into the HSG 2a without reducing the size of the HSG 2a by the heat treatment in the heat-treating step to thereby suppress the reduction in capacitance due to the depletion. Therefore, when As is introduced into the interior of the HSG 2a to form a diffusion region P1, the HSG 2a is not reduced in size at all.

Thus, according to the method of this invention, the dopant is introduced by vapor, phase deposition using the dopant gas which does not react with silicon in order to suppress the depletion of the HSG 2a. Therefore, no reaction with silicon occurs to that the HSG 2a is not reduced in size. As regards the use of $AsH_3$ as the dopant gas, SSDM97, Extended Abstract, page 552 discloses that arsenic (As) of a high concentration can be introduced even at a low temperature on the order of 600° C. The above-mentioned Abstract also teaches in page 110 that $PH_3$ does not have such feature. Therefore, $AsH_3$ rather that $PH_3$ is preferred for use as the dopant gas.

Hereinafter, several specific examples of the method according to this invention will be described.

Example 1

A first as the capacitor electrode forming step, a wafer with a lower electrode of a silicon film formed on a semiconductor substrate is heat-treated in a high vacuum by the use of an HSG forming apparatus. Thus, the capacitor electrode made a—Si containing phosphorus at a concentration of $1E20cm^{-3}$ is subjected to the HSG process.

Then, after the wafer is taken out from the HSG forming apparatus, an oxide film on the surface of the stacked capacitor electrode is removed by the use of diluted HF (hydrogen fluoride) solution, for example, under the condition of $HF:SiO_2=1:100$ for five minutes.

Next as the heat-treating step, the wafer is loaded in a furnace and heated in an oxygen-free atmosphere. The atmosphere is selected from a vacuum and a gas containing $AsH_3$ or $PH_3$. The heat-treatment temperature ranges between 600 and 750° C. In this state, $AsH_3$ is introduced into the furnace at a partial pressure on the order of 0.05 to 50 Torr for a time period between 30 seconds and 10 minutes. As a result of the heat treatment in $AsH_3$, the dopant gas of As is introduced into the HSG at a high concentration as illustrated in FIG. 5. Thereafter, a capacitor nitride film is grown and, if necessary, thermal oxidation is carried out. Then, polysilicon containing P or As or amorphous silicon is grown as the upper electrode and patterning is carried out. Thus, a stacked capacitor as the capacitor electrode is completed. After the HSG has been formed by introducing the As gas in the heat treatment, the HSG'ed lower electrode is exposed in a gas containing the dopant gas within a chamber where the HSG has been formed and without breaking the vacuum.

In the semiconductor device comprising the capacitor electrode, the C—V characteristic of the HSG'ed capacitor electrode is substantially ideal as illustrated in FIG. 2A as a result of introduction of As at a high concentration into the HSG 2a.

Example 2

At first as the capacitor electrode forming step, a wafer with a capacitor electrode of a silicon film formed on a semiconductor substrate is heat-treated in a high vacuum ($1E^{-7}$ Torr or less) by the use of an HSG forming apparatus. Thus, the capacitor electrode made of a—Si containing phosphorus at a concentration of $1E20cm^{-3}$ is subjected to the HSG process.

Then, after the wafer is transferred to another chamber without breaking the high vacuum, the heat-treating step is carried out in which the wafer is heated in an oxygen-free atmosphere. The atmosphere is selected from a vacuum and a gas containing $AsH_3$ or $PH_3$. The heat-treatment temperature ranges between 600 and 750° C. In this state, $AsH_3$ is introduced into the chamber at a partial pressure on the order of 0.05 to 50 Torr for a time period between 30 seconds and 10 minutes. As a result of the heat treatment in $AsH_3$, the dopant gas of As is introduced into the HSG at a high concentration as illustrated in FIG. 5. Thereafter, a capacitor nitride film is grown and, if necessary, thermal oxidation is carried out. Then, polysilicon or amorphous silicon containing P or As is grown as the upper electrode and patterning is carried out. Thus, a stacked capacitor as the capacitor electrode is completed. After the HSG has been formed by introducing the As gas in the heat treatment; the lower electrode is subjected to the similar treatment described in conjunction with Example 1.

In the semiconductor device comprising the capacitor electrode is substantially ideal as illustrated in FIG. 2A as a result of introduction of As at a high concentration into the HSG 2a, like in Example 1.

Example 3

At first as the capacitor electrode forming step, a wafer with a capacitor electrode of a silicon film formed on a semiconductor substrate is heat-treated in a high vacuum ($1E^{-7}$ Torr or less) by the use of an HSG forming apparatus. Thus, the capacitor electrode made of a—Si containing phosphorus at a concentration of $1E20cm^{-3}$ is subjected to the HSG process.

Then, within the same chamber and without breaking the high vacuum, the heat-treating step is carried out in which the wafer is heated in a oxygen-free atmosphere. The atmosphere is selected from a vacuum and a gas containing $AsH_3$ or $PH_3$. The heat-treatment temperature ranges between 600 and 750° C. In this state, $AsH_3$ is introduced into the chamber at a partial pressure on the order of 0.05 to 50 Torr for a time period between 30 seconds and 10 minutes. Thereafter, the temperature of the wafer is kept at 700° C. or less in the $AsH_3$ atmosphere. As a result of the heat treatment in $AsH_3$, the dopant gas of As is introduced into the HSG at a high concentration as illustrated in FIG. 5. Thereafter, a capacitor nitride film, is grown and, if necessary, thermal oxidation is carried out. Then, polysilicon or amorphous silicon containing P or As is grown as the upper electrode and patterning is carried out. Thus, a stacked capacitor as the capacitor electrode is completed. After the HSG has been formed by introducing the As gas in the heat treatment, the lower electrode is subjected to the similar treatment described in conjunction with Example 1.

In the semiconductor device comprising the capacitor electrode, the C—V characteristic of the HSG'ed capacitor electrode is substantially ideal as illustrated in FIG. 2A as a result of introduction of As at a high concentration into the HSG 2a, like in Example 1.

As described above, according to the method of this invention, the capacitor electrode forming step of forming the HSG'ed capacitor electrode on the semiconductor substrate is followed by the heat-treating step of heat-treating the HSG'ed capacitor electrode in the dopant gas which does not produce any reaction product with silicon. Therefore, it is possible to introduce the dopant of a high concentration into the HSG at the moderate temperature not higher than about 800° C. without reducing the size of the HSG so that the reduction in capacitance due to depletion is avoided. In addition, the HSG in the capacitor electrode has a sufficient mechanical strength at its base portion because the HSG is not reduced in size.

What is claimed is:

1. A method of producing a semiconductor device, comprising the steps of:

forming a capacitor electrode by forming on a semiconductor substrate an HSG'ed capacitor electrode comprising a lower electrode of a silicon film, a dielectric film, and an upper electrode; and heat-treating said HSG'ed capacitor electrode in a dopant gas that does not produce a reaction product with silicon.

2. A method as claimed in claim 1, wherein said heat-treating step is carried out in an atmosphere containing said dopant gas in a clean condition such that no oxide film is formed on the surface of each HSG after the HSG is formed.

3. A method as claimed in claim 2, wherein said heat-treating step, the dopant gas is introduced into the HSG at a high concentration without reducing the size of the HSG by said heat-treating.

4. A method as claimed in claim 3, wherein, after the HSG has grown, said HSG'ed lower electrode is exposed in a gas containing said dopant gas within a chamber where the HSG has grown and without breaking a vacuum.

5. A method as claimed in claim 3, wherein said dopant gas is $AsH_3$.

6. A method as claimed in claim 3, wherein said dopant gas is $PH_3$.

7. A method as claimed in any one of claims 3 to 6, wherein said heat-treating step is carried out at a temperature between 550 and 800° C.

* * * * *